US009160951B2

(12) United States Patent
Saitou et al.

(10) Patent No.: US 9,160,951 B2
(45) Date of Patent: Oct. 13, 2015

(54) SOLID-STATE IMAGING APPARATUS HAVING A LIGHT COLLECTING ELEMENT WITH AN EFFECTIVE REFRACTIVE INDEX DISTRIBUTION

(71) Applicant: Panasonic Corporation, Osaka (JP)

(72) Inventors: Shigeru Saitou, Kyoto (JP); Kazutoshi Onozawa, Osaka (JP)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 0 days.

(21) Appl. No.: 14/171,953

(22) Filed: Feb. 4, 2014

(65) Prior Publication Data

US 2014/0152880 A1    Jun. 5, 2014

Related U.S. Application Data

(63) Continuation of application No. PCT/JP2012/004638, filed on Jul. 20, 2012.

(30) Foreign Application Priority Data

Aug. 8, 2011    (JP) .................................. 2011-172636

(51) Int. Cl.
*H04N 5/369*    (2011.01)
*G02B 5/18*    (2006.01)
(Continued)

(52) U.S. Cl.
CPC ............ *H04N 5/3696* (2013.01); *G02B 5/1885* (2013.01); *G02B 19/0076* (2013.01); *H01L 27/14627* (2013.01); *H01L 27/14629* (2013.01)

(58) Field of Classification Search
CPC ...... H04N 5/3696; G02B 5/1885; G02B 5/32; G02B 5/1876; H01L 27/146; H01L 27/14629; H01L 27/14627; H01L 27/14621; H01L 27/14685; H01L 27/14625; H01L 27/14687; H01L 27/14632; H01L 31/02162; H01L 31/0232; H01L 31/02165
USPC .......................................................... 348/308
See application file for complete search history.

(56) References Cited

U.S. PATENT DOCUMENTS 7,663,084 B2    2/2010    Toshikiyo et al.
7,692,129 B2    4/2010    Toshikiyo et al.
(Continued)

FOREIGN PATENT DOCUMENTS

JP    2006-351972    12/2006
JP    2009-135236    6/2009
(Continued)

OTHER PUBLICATIONS

International Search Report issued Aug. 28, 2012 in International (PCT) Application No. PCT/JP2012/004638.

*Primary Examiner* — Pritham Prabhakher
(74) *Attorney, Agent, or Firm* — Wenderoth, Lind & Ponack, LLP

(57) ABSTRACT

A solid-state imaging apparatus includes unit pixels each having a light-collecting element for collecting incident light, the light-collecting element: is divided into a plurality of zones each having a ring shape of concentric structure and a line width shorter than a wavelength of the incident light; and has an effective refractive index distribution controlled according to a combination of the zones, and in at least one of the zones, a light-transmissive film which is included in the zone is divided in a circumferential direction of the concentric structure at an interval shorter than the wavelength of the incident light.

7 Claims, 11 Drawing Sheets

(51) Int. Cl.
*H01L 27/146* (2006.01)
*G02B 19/00* (2006.01)

(56) References Cited

U.S. PATENT DOCUMENTS

| | | | | |
|---|---|---|---|---|
| 7,718,949 B2 * | 5/2010 | Toshikiyo | ..................... | 250/216 |
| 7,728,901 B2 * | 6/2010 | Onozawa et al. | ............. | 348/340 |
| 7,846,620 B2 * | 12/2010 | Ishii et al. | ......................... | 430/5 |
| 8,004,595 B2 * | 8/2011 | Onozawa | ..................... | 348/335 |
| 8,018,508 B2 | 9/2011 | Toshikiyo | | |
| 8,848,092 B2 * | 9/2014 | Yukawa | ........................ | 348/340 |
| 2006/0284052 A1 | 12/2006 | Toshikiyo et al. | | |
| 2006/0285228 A1 * | 12/2006 | Ishii et al. | ..................... | 359/742 |
| 2007/0146531 A1 | 6/2007 | Toshikiyo | | |
| 2008/0076039 A1 * | 3/2008 | Ishii et al. | ........................ | 430/5 |
| 2008/0185500 A1 * | 8/2008 | Toshikiyo | .................. | 250/208.1 |
| 2009/0020840 A1 | 1/2009 | Toshikiyo et al. | | |
| 2009/0141153 A1 * | 6/2009 | Onozawa | ..................... | 348/294 |
| 2011/0134531 A1 * | 6/2011 | Takasu et al. | .................. | 359/565 |
| 2011/0267693 A1 * | 11/2011 | Kobayashi et al. | ........... | 359/569 |
| 2011/0285898 A1 * | 11/2011 | Kasahara et al. | .............. | 348/360 |
| 2012/0033126 A1 * | 2/2012 | Ishii | ............................. | 348/340 |
| 2012/0092769 A1 * | 4/2012 | Nishiwaki et al. | ............. | 359/570 |

FOREIGN PATENT DOCUMENTS

| | | | |
|---|---|---|---|
| JP | 2010-27875 | | 2/2010 |
| JP | 2010-171861 | * | 8/2010 |
| WO | 2005/101067 | | 10/2005 |

* cited by examiner

With conventional minimum basic structure

With minimum basic structure in present disclosure

SOLID-STATE IMAGING APPARATUS HAVING A LIGHT COLLECTING ELEMENT WITH AN EFFECTIVE REFRACTIVE INDEX DISTRIBUTION

CROSS REFERENCE TO RELATED APPLICATION

This is a continuation application of PCT International Application No. PCT/JP2012/004638 filed on Jul. 20, 2012, designating the United States of America, which is based on and claims priority of Japanese Patent Application No. 2011-172636 filed on Aug. 8, 2011. The entire disclosures of the above-identified applications, including the specifications, drawings and claims are incorporated herein by reference in their entirety.

FIELD

The present disclosure relates to solid-state imaging apparatuses for use in digital cameras.

BACKGROUND

The market for solid-state imaging apparatuses has expanded remarkably following the wide use of the digital cameras and mobile phones with cameras. In recent years, the demand for thinner digital cameras is getting stronger. Stated differently, this means that the focal length of a lens used for the camera module becomes shorter, and that light enters a solid-state imaging apparatus at a wide angle (that is, an angle obtained when measuring from a vertical axis of an incident surface of the solid-state imaging apparatus is wider).

In solid-state imaging apparatuses such as charge coupled device (CCD) image sensors or complementary metal oxide semiconductor (CMOS) image sensors, semiconductor integrated circuits having light-receiving parts are arranged in a two-dimensional array to convert a light signal from a subject into an electric signal. The sensitivity of the solid-state imaging apparatus is defined based on an amount of output current of a light-receiving element to an amount of incident light. Therefore, guiding the incident light surely into the light-receiving element is an important factor for improving the sensitivity.

In order to achieve this, it is required to improve light-collection efficiency of a microlens formed on the top portion of the CCD image sensor and the CMOS image sensor. The existing microlens is a resin spherical lens, and is used for almost all the solid-state imaging apparatuses including the CCD image sensors and the CMOS image sensors.

FIG. 10 shows an example of a basic structure of a pixel in a conventional solid-state imaging apparatus. A solid-state imaging apparatus 500 includes a microlens 501, a color filter 502, wire layers 503, a light-receiving element 506, and a Si substrate 507. As shown in FIG. 10, incident light 502A (dashed lines) which enters vertically into the microlens 501 is separated into colors using any one of the red (R), green (G), and blue (B) color filters 502, and then enters into the light-receiving element 506 without being affected by the light-blocking effect by the wire layers 503, and is converted into an electric signal at the light-receiving element 506.

FIG. 11 shows an example of a structure of a peripheral pixel in the conventional solid-state imaging apparatus. In peripheral pixels of the solid-state imaging apparatus 510, the incident angle of the incident light 502B (solid line) is large, and the wire layers 503 is shifted (shrunk) inwardly in an attempt to improve the light-collection efficiency.

However, in a fine pixel or a short-focal-length optical system such as miniature cameras where the incident angle of the incident light in the peripheral pixels is increased significantly, there is a problem that the circuit cannot be shrunk any more.

In order to address the above-described problem in wide-angle incidence to the peripheral pixels, Patent Literature (PTL) 1 proposes a solid-state imaging apparatus in which a refractive index distribution light-collecting element having an effective refractive index distribution is formed by its structure which is substantially the same as or finer than the wavelength of the incident light. With the solid-state imaging apparatus disclosed in PTL 1 in which the refractive index distribution type light-collecting elements having different refractive indices in the center portion, intermediate portion, and the peripheral portion of the imaging region is provided, even when the light enters into the peripheral pixels obliquely at a great angle relative to a vertical axis of the incident surface, the incident light can be collected at the light-receiving element and the sensitivity equivalent to that obtained at the center portion of the solid-state imaging apparatus can be obtained.

CITATION LIST

Patent Literature

[PTL 1] Japanese Unexamined Patent Application Publication No. 2006-351972

SUMMARY

The distribution refractive index light-collecting element described above is divided into a plurality of zones each having a concentric structure and a line width substantially the same as or shorter than a wavelength of the incident light. However, the desired refractive index distribution is formed by a combination of minimum basic structures which have different volume ratios and include the high refractive index material and the low refractive index material. Therefore, the accuracy of reproducibility of the refractive index distribution is determined according to the combination of minimum basic structures.

Thus, it is sometimes difficult to realize the desired light-collection property in the case where a large quantization error is caused between the desired refractive index distribution and the effective refractive index distribution of the light-collecting element actually formed by the combination of the minimum basic structures.

However, the conventional technique disclosed in PTL 1 provides only six patterns of the combination of the minimum basic structures. This deteriorates the reproducibility of the refractive index distribution, lowers the design flexibility, and reduces the light-collection efficiency. The conventional technique discloses increasing the number of layers of the minimum basic structure in the light-collecting element to suppress the above problem, however, the number of masks and the manufacturing processes is increased which ends up increasing the costs.

The present disclosure has been conceived in view of the above problems, and has an object to provide a solid-state imaging apparatus which includes a light-collecting element capable of improving the reproducibility of the refractive index distribution and the light-collection efficiency, by increasing the patterns of combination of the minimum basic structures without increasing the number of masks and the manufacturing processes.

In order to solve the above problem, a solid-state imaging apparatus according to an aspect of the present disclosure is a solid-state imaging apparatus including unit pixels, the unit pixels each having a light-collecting element for collecting incident light, the light-collecting element: is divided into a plurality of zones each having a ring shape of concentric structure and a line width shorter than a wavelength of the incident light; and has an effective refractive index distribution controlled according to a combination of the zones, and in at least one of the zones, a light-transmissive film which is included in the zone is divided in a circumferential direction of the concentric structure at an interval shorter than the wavelength of the incident light.

With this, a more accurate effective refractive index distribution as compared with the conventional light-collecting element having a zone in a ring shape is realized without performing the complicated process including: dividing the layering process into a plurality of processes; and patterning the light-transmissive film per layering process while aligning the masks in each processing. With this, reproducibility of the desirable refractive index distribution of the light-collecting element can be improved without increasing the number of masks or manufacturing processes. Furthermore, the light-collection efficiency improves and the sensitivity of the solid-state imaging apparatus improves.

Furthermore, it is beneficial that the light-transmissive film of the zone includes a plurality of arc-shaped light-transmissive film elements divided at an interval shorter than the wavelength of the incident light.

With this, the light-transmissive film included in the zone has an effective refractive index distribution symmetrical to a center point of the arc.

Furthermore, the arc-shaped light-transmissive film elements may be provided continuously with a light-transmissive film in a ring shape arranged along an inner circumference or an outer circumference of the arc-shaped light-transmissive film element.

In the case where a region neighboring the arc-shaped light-transmissive film element is a region in which no light-transmissive film is formed, a sharp change occurs in the effective refractive index. In contrast, in the case where the arc-shaped light-transmissive film elements are provided continuously with the ring-shape light-transmissive film adjacent to the inner circumference or outer circumference of the arc-shaped light-transmissive film element, the sharp change in the effective refractive index does not occur, which makes it possible to reduce the quantization error in the effective refractive index distribution.

Furthermore, the arc-shaped light-transmissive film elements may each be disposed on a same circumference concentric to a center of one of the unit pixels.

With this, the light-transmissive film included in the zone has an effective refractive index distribution symmetrical to a center of the unit pixel.

Furthermore, in order to solve the above problem, an imaging apparatus according to an aspect of the present disclosure includes: any one of the above solid-state imaging apparatuses; and an imaging lens arranged on a light incident side of the light-collecting element, the imaging lens being for guiding light, wherein the imaging lens is an interchangeable lens including: a first imaging lens which guides the light onto the light-collecting element in a wide-angle manner; and a second imaging lens which guides the light onto the light-collecting element telecentrically.

With this, an accurate effective refractive index distribution capable of supporting both wide-angle and telecentric imaging lenses can be achieved without complicated processes, regardless of which of the lenses is selected. With this, reproducibility of the desirable refractive index distribution of the light-collecting element can be improved without increasing the number of masks or manufacturing processes. Furthermore, the light-collection efficiency improves and the sensitivity of the imaging apparatus improves.

With the solid-state imaging apparatus according to the present disclosure, reproducibility of the desirable refractive index distribution of the light-collecting element can be improved without increasing the number of masks and manufacturing processes. With this, the light-collection efficiency improves and the sensitivity of the solid-state imaging apparatus improves.

BRIEF DESCRIPTION OF DRAWINGS

These and other objects, advantages and features of the invention will become apparent from the following description thereof taken in conjunction with the accompanying drawings that illustrate a specific embodiment of the present invention.

DETAILED DESCRIPTION OF INVENTION

The following describes the embodiment in detail with reference to the Drawings. Although the following description is based on the embodiment below and the drawings attached, the embodiment and the drawings are given for illustrative purpose only and are not intended to limit the scope of the present disclosure.

Figure 1:
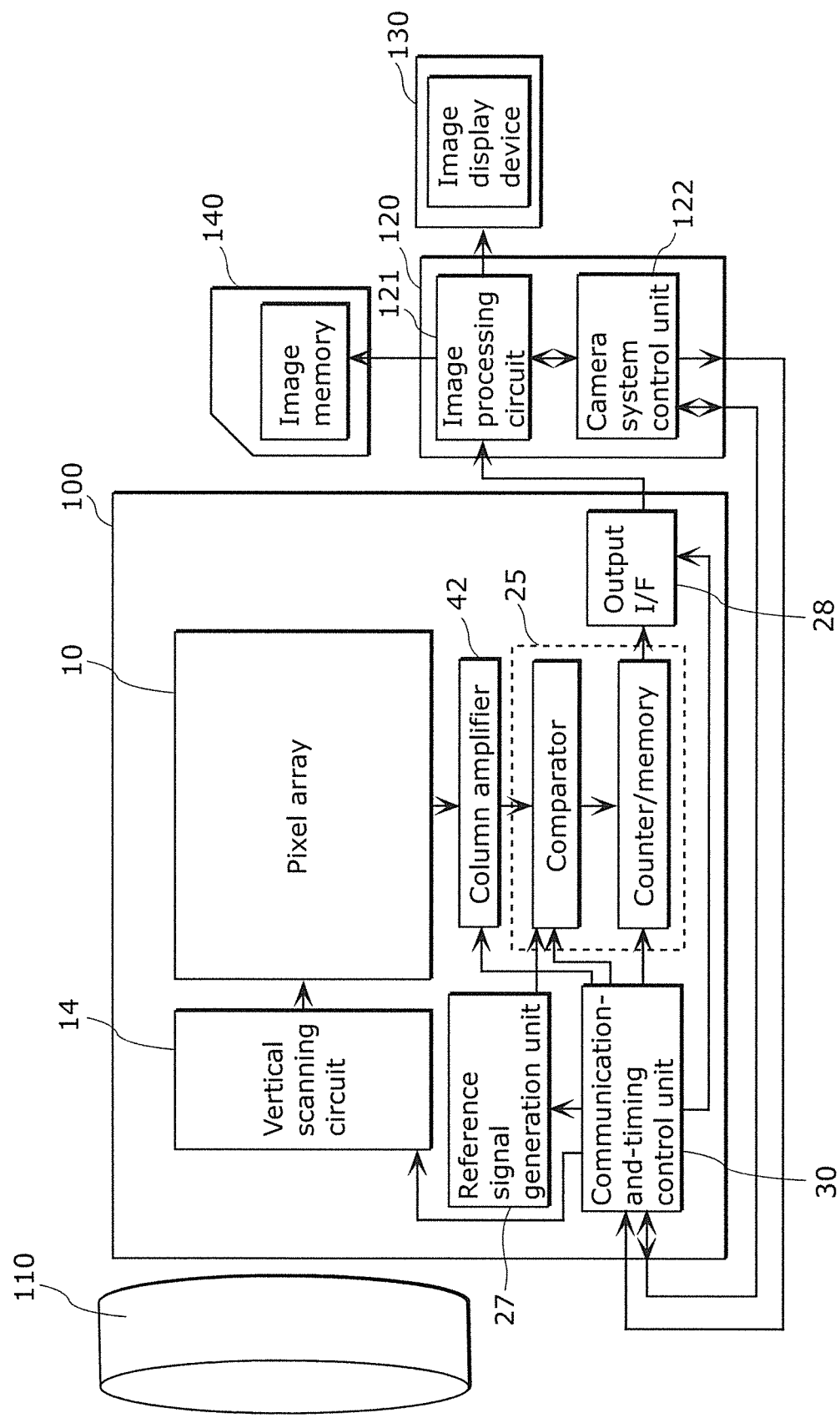
FIG. 1 shows a schematic configuration of an imaging apparatus (camera) according to an embodiment.
Figure 2:
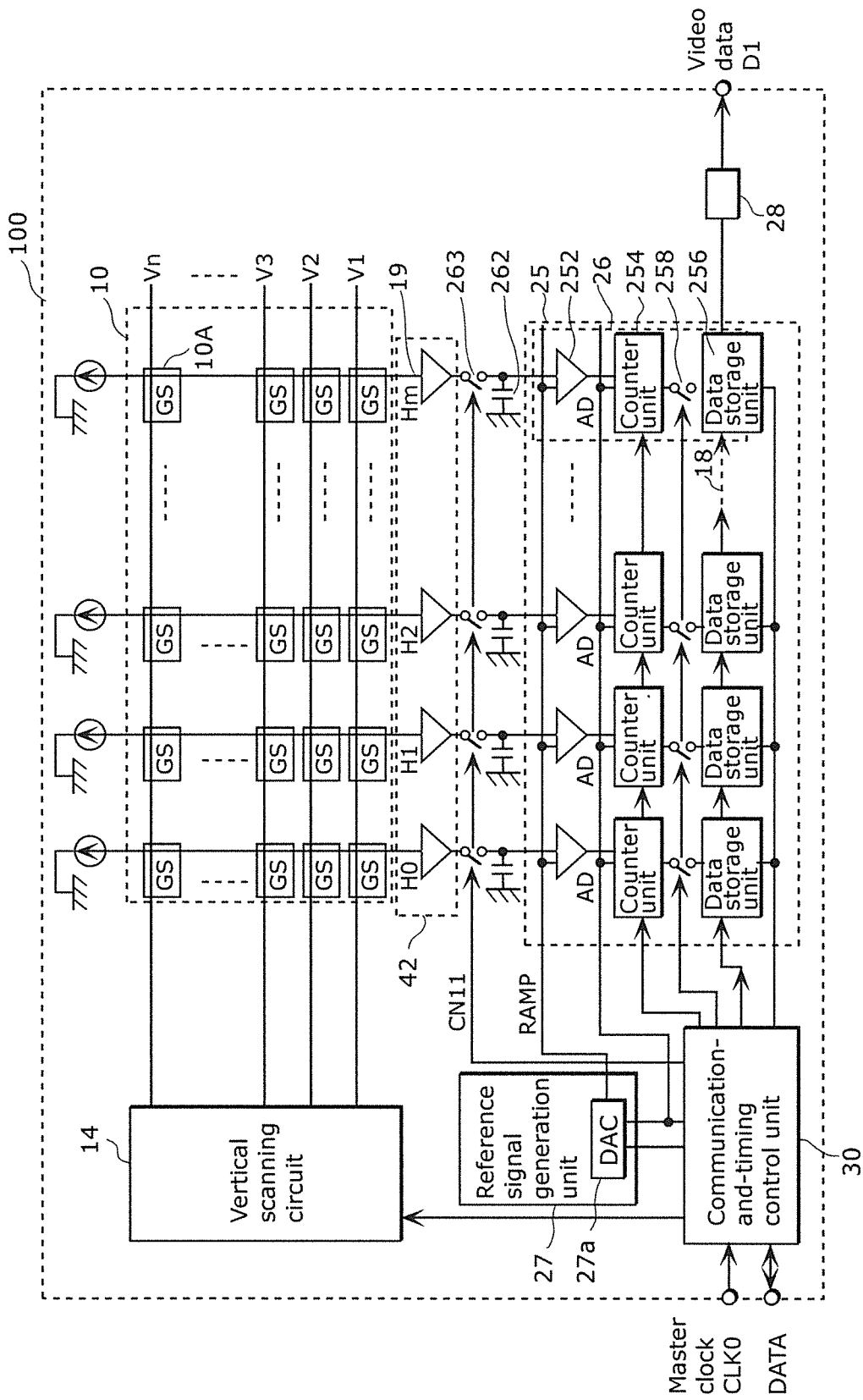
FIG. 2 shows a detailed configuration of a solid-state imaging apparatus according to the embodiment.

FIG. 1 shows a schematic configuration of an imaging apparatus (camera) according to the embodiment. Furthermore, FIG. 2 shows a detailed configuration of a solid-state imaging apparatus according to the embodiment. The imaging apparatus shown in FIG. 1 includes a solid-state imaging apparatus 100, a lens 110, a digital signal processing circuit (DSP) 120, an image display device 130, and an image memory 140.

In a digital single-lens camera, the lens 110 is an interchangeable lens. It is to be noted that the present disclosure is not limited to be applicable for the digital single-lens camera in which an interchangeable lens is used, but is also applicable for an imaging apparatus (camera) not provided with the interchangeable lens but provided with a lens capable of zooming at a high-magnification such as greater than or equal to ten times, for example.

Figure 3:
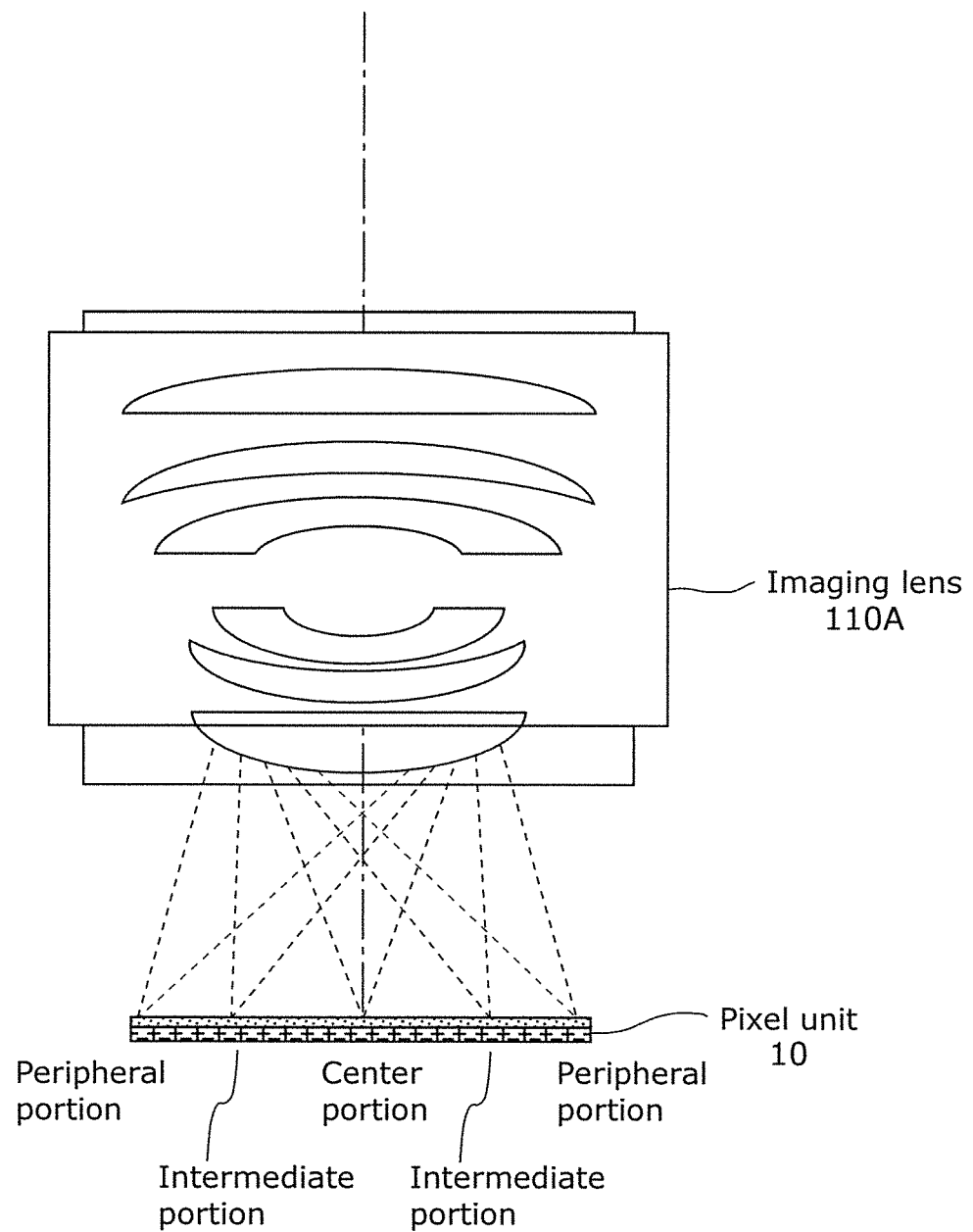
FIG. 3 shows how light enters from an imaging lens into the solid-state imaging apparatus at a wide angle.
Figure 4:
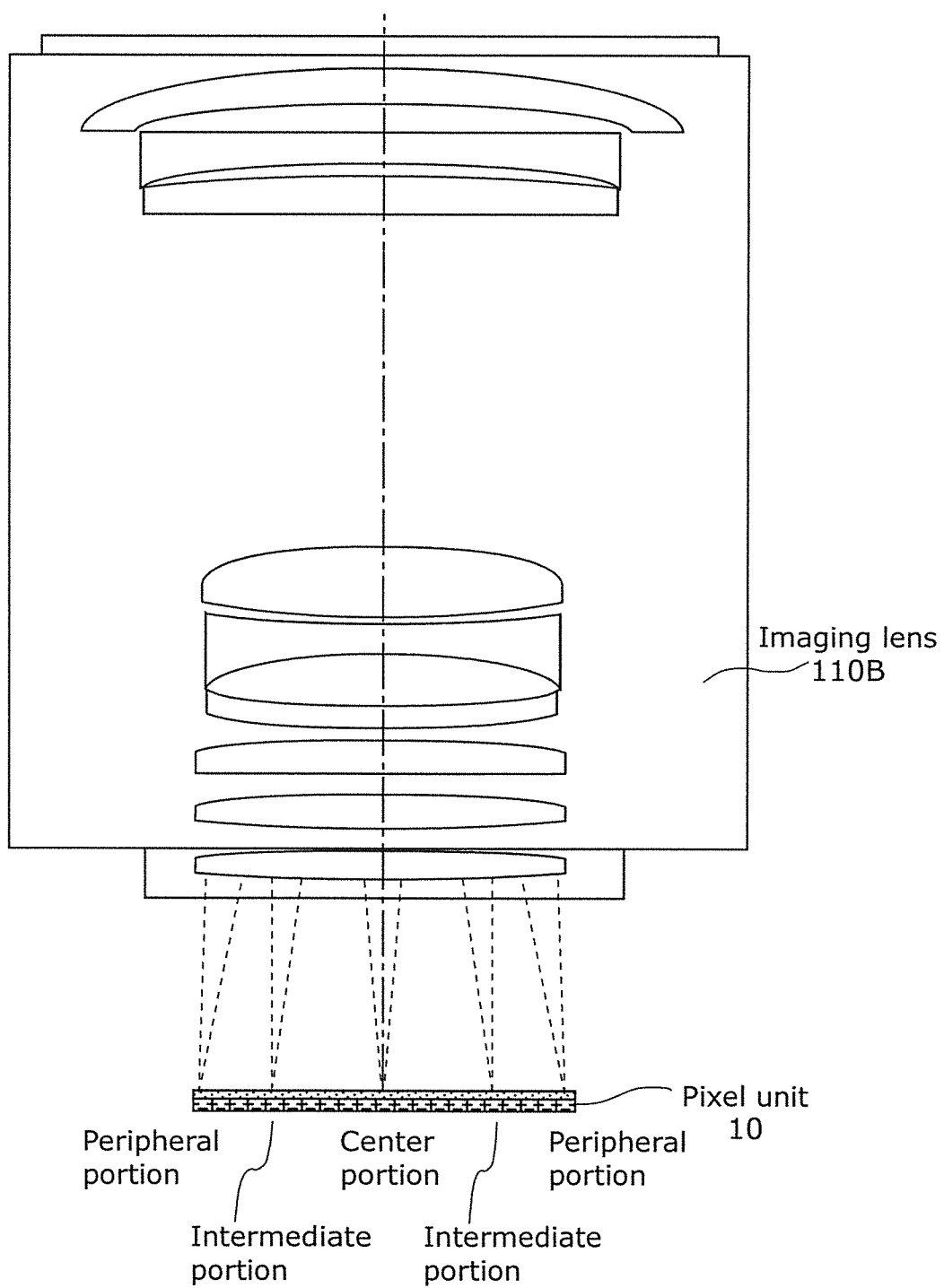
FIG. 4 shows how light enters from the imaging lens into the solid-state imaging apparatus telecentrically (in a manner that an optical axis and a principal light ray are substantially parallel).

FIG. 3 shows how light enters from an imaging lens into the solid-state imaging apparatus at a wide angle. As shown in FIG. 3, an imaging lens 110A is selected as a lens 110 in the case where the light is to be guided at a wide angle. Furthermore, FIG. 4 shows how the light enters from the imaging lens into the solid-state imaging apparatus telecentrically (in a manner that an optical axis and a principal light ray are substantially parallel). As shown in FIG. 4, an imaging lens 110B is selected as the lens 110 in the case where the light is to be guided telecentrically.

In the imaging apparatus according to the present embodiment, the light enters from outside via the lens 110 and the incident light is converted into a digital signal and output by the solid-state imaging apparatus 100. Then, the output digital signal is processed by the DSP 120 and is output as a video signal to and recorded in the image memory 140, and is output and displayed as an image by the image display device 130.

The DSP 120 includes: an image processing circuit 121 which generates a video signal by performing processing such as noise removal on the output signal of the solid-state imaging apparatus 100; and a camera system control unit 122 which controls scanning timing and gain of the pixels in the solid-state imaging apparatus 100. The DSP 120 corrects differences in features between the pixels shared in the unit pixels in the solid-state imaging apparatus 100, for example.

The solid-state imaging apparatus 100 is formed of a single chip, and the chip on which the solid-state imaging apparatus 100 is formed and the chip on which the DSP 120 is formed are different chips. With this, the process for forming the solid-state imaging apparatus 100 and the process for forming the DSP 120 can be separated and thus the processes for manufacturing the imaging unit and the processing unit can be separated, thereby reducing the manufacturing processes and the costs. Furthermore, each user is allowed to set timing control, gain control, and image processing freely, thereby improving the flexibility in usage.

The solid-state imaging apparatus 100 is a complementary metal oxide semiconductor (CMOS) solid-state imaging apparatus, and includes as shown in FIG. 1 and FIG. 2: a pixel unit (pixel array) 10; a vertical scanning circuit (row scanning circuit) 14; a communication-and-timing control unit 30; an analog/digital (AD) converter circuit 25; a reference signal generation unit 27; an output I/F 28; a signal holding switch 263; a signal holding capacitor 262; and a column amplifier 42. Hereinafter, description is provided on a function of the solid-state imaging apparatus 100 with reference to FIG. 2.

The pixel unit 10 includes a plurality of unit cells 10A arranged two-dimensionally (in rows and columns) on a well of a semiconductor substrate. Each of the unit cells 10A includes a plurality of unit pixels (photoelectric conversion elements). Each of the unit cells 10A is connected to: a signal line controlled by the vertical scanning circuit 14; and a vertical signal line 19 which transmits a voltage signal from the corresponding unit cell 10A to the AD conversion unit 25.

The vertical scanning circuit 14 scans the unit cells 10A in a vertical direction on a row-by-row basis, and selects a row of unit cells 10A with the vertical signal line 19 from which the voltage signal is output.

The communication-and-timing control unit 30 receives master clock CLK0 and DATA input via an external terminal, generates various internal clock, and controls the reference signal generation unit 27, the vertical scanning circuit 14, and so on.

The reference signal generation unit 27 includes a digital/analog converter (DAC) 27a, which supplies a reference voltage RAMP for AD conversion to a column analog/digital converter (column AD) circuit 26 of the AD conversion circuit 25.

The column amplifier 42, the signal holding switch 263, and the signal holding capacitor 262 are provided for each column of the unit cells 10A. The column amplifier 42 amplifies the voltage signal output from the corresponding unit cells 10A, and the signal holding capacitor 262 holds the amplified voltage signal transmitted via the signal holding switch 263. Providing the column amplifier 42 allows amplifying the voltage signal of the unit cells 10A, thereby improving signal/noise (S/N) and switching gain.

The AD conversion circuit 25 includes a plurality of column AD circuits 26 each provided for a column of the unit cells 10A. The column AD circuit 26 converts the analog voltage signal of the signal holding capacitor 262 output from the unit cells 10A into a digital signal, using the reference voltage RAMP generated by the DAC 27a.

The column AD circuit 26 includes a voltage comparison unit 252, a switch 258, and a data storage unit 256. The voltage comparison unit 252 compares, with the reference voltage RAMP, the analog voltage signal obtained from the unit cells 10A via the vertical signal line 19 (H0, H1, . . . ) and the signal holding capacitor 262. The data storage unit 256 is configured as a memory which holds: time taken until the voltage comparison unit 252 completes the comparison processing; and the result of counting performed using the counter unit 254.

The voltage comparison unit 252 has one input terminal which receives, together with the input terminals of other voltage comparison units 252, the reference voltage RAMP in stages generated by the DAC 27a. The other input terminal of the voltage comparison unit 252 is connected to the signal holding capacitor 262 of the corresponding one of the columns, and receives the voltage signal from the pixel unit 10. The output signal of the voltage comparison unit 252 is supplied to the counter unit 254.

The column AD circuit 26 starts counting using the clock signal at the same time when the reference voltage RAMP is supplied to the voltage comparison unit 252, and performs AD conversion by counting until a pulse signal is obtained, by comparing the analog voltage signal input via the signal holding capacitor 262 with the reference voltage RAMP.

At this time, the column AD circuit 26 performs, together with the AD conversion, processing for taking a differential between (i) the signal level (noise level) immediately after the pixels are reset and (ii) a true signal level Vsig (according to received light amount), on the pixel signal (voltage signal) of a voltage mode input via the signal holding capacitor 262.

Accordingly, noise signal components called fixed pattern noise (FPN), reset noise, and the like, can be removed from the voltage signal.

The column AD circuit 26 extracts only the true signal level Vsig by down counting the noise level and up counting the signal level. The signal digitized by the column AD circuit 26 is input to the output I/F 28 via the horizontal signal line 18.

Although the solid-state imaging apparatus 100 shown in FIG. 1 and FIG. 2 is provided with the column AD circuit 26, the AD circuit may be provided outside of the solid-state imaging apparatus.

As described above, with the above configuration, the pixel unit 10 sequentially outputs the voltage signal per row of the unit cells 10A. Furthermore, a frame image that is an image of one sheet for the pixel unit 10 is shown by a group of voltage signals of the entire pixel unit 10.

Next, description is provided on a structure of a light-collecting element of the solid-state imaging apparatus 100.

Figure 5A:
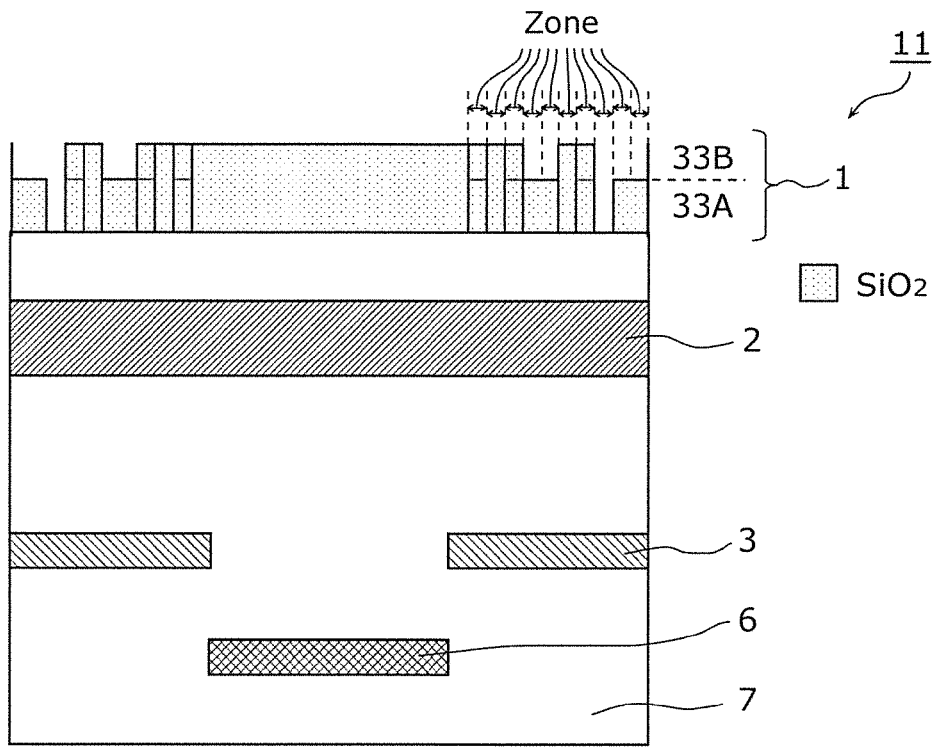
FIG. 5A is a sectional view showing an example of a basic structure of a unit pixel of the solid-state imaging apparatus according to the embodiment.
Figure 5B:
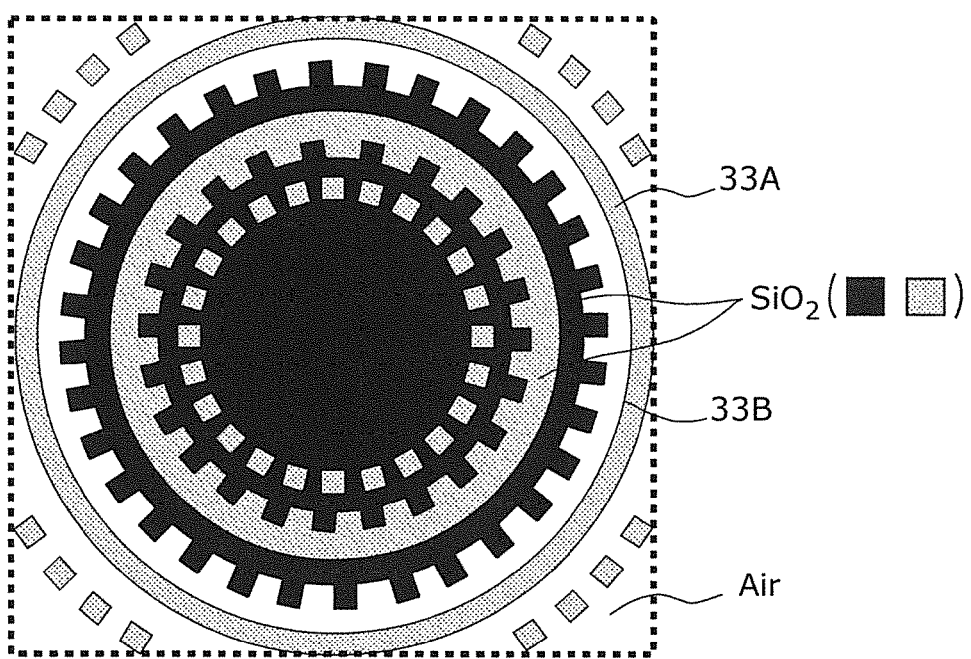
FIG. 5B shows an example of top view of a light-collecting element formed on a unit pixel of the solid-state imaging apparatus according to the embodiment.

FIG. 5A is a sectional view showing an example of the basic structure of the unit pixel of the solid-state imaging apparatus according to the embodiment. FIG. 5B shows an example of top view of a light-collecting element formed on a unit pixel of the solid-state imaging apparatus according to the embodiment.

As shown in FIG. 5A, the unit pixel 11 of the solid-state imaging apparatus according to the present embodiment includes: a light-collecting element 1 that is the distribution gradient index lens, a color filter 2, a wire layer 3, a light-receiving element (Si photodiode) 6, and an Si substrate 7. The light-collecting element 1 has a film thickness of 1.2 μm, for example.

The light-collecting element 1 has a concentric structure in which $SiO_2$ (refractive index n=1.45) that is the light-transmissive film is disposed concentrically. Here, each of the regions obtained by dividing the light-collecting element 1 into donut shapes is defined as a zone. The zone has a width that is the difference between the inner circumferential radii, and a ring shape of concentric structure. The light-collecting element 1 is formed with a combination of a plurality of the zones, and each of the zones has a line width shorter than the wavelength of the incident light.

Furthermore, the light-collecting element 1 has a two-layer structure of a lower-layer light-transmissive film 33A and an upper-layer light-transmissive film 33B. $SiO_2$ that is the lower-layer light-transmissive film 33A has a film thickness of 0.8 μm for example, and $SiO_2$ that is the upper-layer light-transmissive film 33B has a film thickness of 0.4 μm, for example. Furthermore, the medium around $SiO_2$ is the air (refractive index n=1.00). When the line width of the zone is substantially the same as or smaller than the wavelength of the incident light, the effective refractive index to the incident light can be calculated by a volume ratio of $SiO_2$ (n=1.45) that is the light-transmissive film and the air (n=1.00) which is the medium around $SiO_2$. By arbitrarily combining the effective refractive index per zone, a desired effective refractive index distribution can be realized. As described above, the solid-state imaging apparatus in the present disclosure has a feature that the effective refractive index distribution can be controlled freely by simply changing the volume ratio of the light-transmissive film and the air in the zone.

Furthermore, as shown in FIG. 5B, in the light-collecting element 1, in at least one of the zones, a light-transmissive film which is included in the zone is divided in a circumferential direction of the concentric structure at an interval shorter than the wavelength of the incident light. With the light-collecting element 1 as configured above, a more accurate effective refractive index distribution can be realized as compared with the conventional light-collecting element having a zone in a ring shape.

Here, the above-described expression of "a light-transmissive film which is included in the zone is divided in a circumferential direction of the concentric structure at an interval shorter than the wavelength of the incident light" is applicable for the following: an aspect where (i) a region in which both of the lower-layer light-transmissive film 33A and the upper-layer light-transmissive film 33B are formed at the above predetermined interval and (ii) a region in which none of the lower-layer light-transmissive film 33A and the upper-layer light-transmissive film 33B is formed are alternately arranged in a circumferential direction of the concentric structure; an aspect where (i) a region in which both of the lower-layer light-transmissive film 33A and the upper-layer light-transmissive film 33B are formed at the above predetermined interval and (ii) a region in which only the lower-layer light-transmissive film 33A is formed are alternately arranged in the circumferential direction of the concentric structure; and an aspect where (i) a region in which only the lower-layer light-transmissive film 33A is formed at the above predetermined interval and (ii) a region in which none of the lower-layer light-transmissive film 33A and the upper-layer light-transmissive film 33B is formed are alternately arranged in the circumferential direction of the concentric structure.

Furthermore, it is beneficial that the light-transmissive film of the zone includes a plurality of arc-shaped light-transmissive film elements divided at an interval shorter than the wavelength of the incident light. With this, the light-transmissive film included in the zone has an effective refractive index distribution symmetrical to a center point of the arc.

Here, the above-described arc-shaped light-transmissive film element is: one unit of the light-transmissive film in which both of the lower-layer light-transmissive film 33A and the upper-layer light-transmissive film 33B are divided at an interval shorter than the wavelength of the incident light in the circumferential direction of the concentric structure; or one unit of the light-transmissive film in which only the lower-layer light-transmissive film 33A is divided at an interval shorter than the wavelength of the incident light in the circumferential direction of the concentric structure.

Furthermore, the above-described arc-shaped light-transmissive film element includes the lower-layer light-transmissive film 33A and the upper-layer light-transmissive film 33B, and is divided in a part formed only with the lower-layer light-transmissive film 33A. Furthermore, a part of the arc-shaped light-transmissive film elements may be provided continuously with the light-transmissive film in a ring shape arranged along the inner circumference or outer circumference of the arc-shaped light-transmissive film element. In the case where a region neighboring the arc-shaped light-transmissive film element formed up to the upper light-transmissive film 33B is a region in which no light-transmissive film is formed, a sharp change occurs in the effective refractive index. In contrast, in the case where the arc-shaped light-transmissive film elements are provided continuously with the ring-shape light-transmissive film adjacent to the inner circumference or outer circumference of the arc-shaped light-transmissive film element, the sharp change in the effective refractive index does not occur, which makes it possible to reduce the quantization error in the effective refractive index distribution described later.

Furthermore, the arc-shaped light-transmissive film elements may each be disposed on a same circumference concentric to a center of one of the unit pixels. With this, the light-transmissive film included in the zone can have an effective refractive index distribution symmetrical to a center of the unit pixel 11.

As described above, the light-collecting element 1 includes a combination of a plurality of zones each having a concentric structure and a line width substantially the same as or shorter than a wavelength of the incident light, and thus the light-collecting element serves as a microlens having an effective refractive index distribution. Furthermore, in at least one of the zones, the light-transmissive film of the concentric structure is divided in a circumferential direction of the concentric structure at an interval shorter than the wavelength of the incident light.

Figure 6:
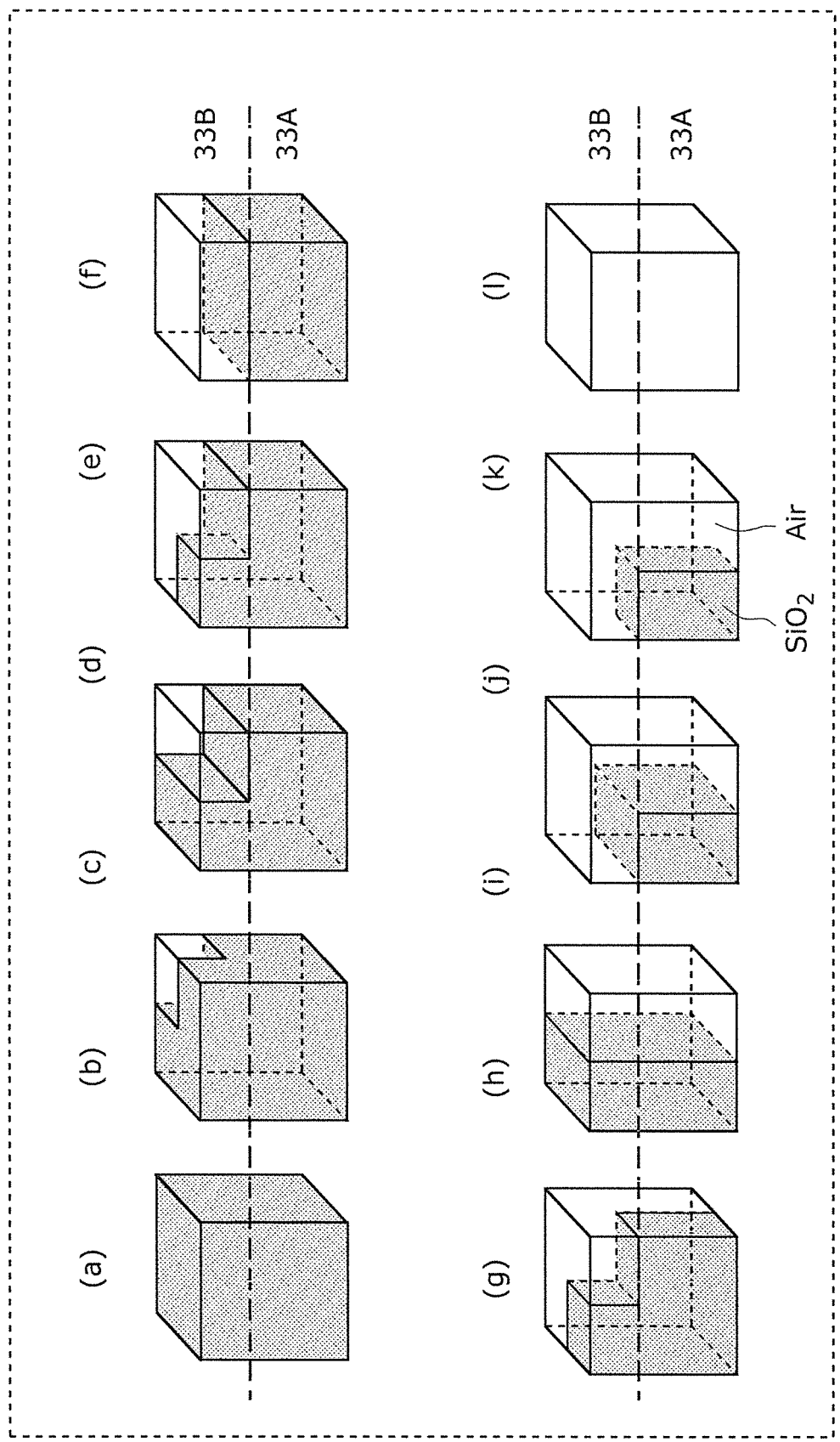
FIG. 6 shows a minimum basic structure of a light-collecting element according to the embodiment.

FIG. 6 shows a minimum basic structure of the light-collecting element according to the embodiment. (a) to (l) in FIG. 6 shows a minimum basic structure for realizing the effective refractive index distribution of the light-collecting element of the solid-state imaging apparatus according to the embodiment. The concentric structure of the light-collecting element 1 shown in FIG. 5B is realized by combining the minimum basic structure shown in (a) to (l) in FIG. 6 as appropriate.

Here, the effective refractive index $n_{eff}$ can be represented by the following equation.

[Math 1]

$$n_{eff}^2 = n_{SiO_2}^2 \cdot f + n_{Air}^2 \cdot (1-f) \quad \text{(Equation 1-1: TE wave)}$$

[Math 2]

$$\frac{1}{n_{eff}^2} = \frac{1}{n_{SiO_2}^2} \cdot f + \frac{1}{n_{Air}^2} \cdot (1-f) \quad \text{(Equation 1-2: TM wave)}$$

Here, $n_{SiO2}$ represents a refractive index of $SiO_2$, $n_{Air}$ represents a refractive index of the air, and f represents a volume ratio of $SiO_2$ in the minimum basic structure. Here, the volume ratio f of $SiO_2$ is a value obtained when the volume of the minimum basic structure is the denominator and the volume ratio of $SiO_2$ is the numerator, and represents the filling rate. Specifically, a structure has a higher effective refractive index as f of the structure is greater, and a structure has a lower effective refractive index as f is smaller.

The light-collecting element 1 according to the present embodiment is formed by introducing the minimum basic structure with an increased filling rate and increased number of variations in the shape, as compared with the conventional minimum basic structure, in order to reduce the quantization error which is a difference between the desirable refractive index distribution and the effective refractive index distribution of the light-collecting element actually formed.

Specifically, the minimum basic structure of 10 levels shown in (a) to (l) in FIG. 6 is used to realize the light-collecting element 1 in the present disclosure. This means that 1.5 times more levels are available than the conventional minimum basic structure of 6 levels disclosed in PTL 1. This is realized since the light-collecting element 1 according to the present embodiment can have levels also in the circumferential direction of the concentric structure by dividing in the circumferential direction the concentric structure at a line width shorter than a wavelength of the incident light, while the conventional structure is based on a ring-shape structure of a concentric structure. This increase of the levels is not brought by the conventional concept of establishing the minimum basic structure in the two-dimensional cube but by a concept of establishing the minimum basic structure in the three-dimensional cube. Therefore, this does not rely on the conventional processes including increasing the number of layers and basic design rules, and is an effective way to fundamentally improve the reproducibility of the refractive index. Furthermore, the advantageous effect of reduction of quantization error, which occurs due to the level-increase, increases as the difference between refractive indices of the materials forming the light-collecting element is larger. Therefore, the present disclosure can also support the cell size miniaturization and incident angle range expansion.

Figure 7A:
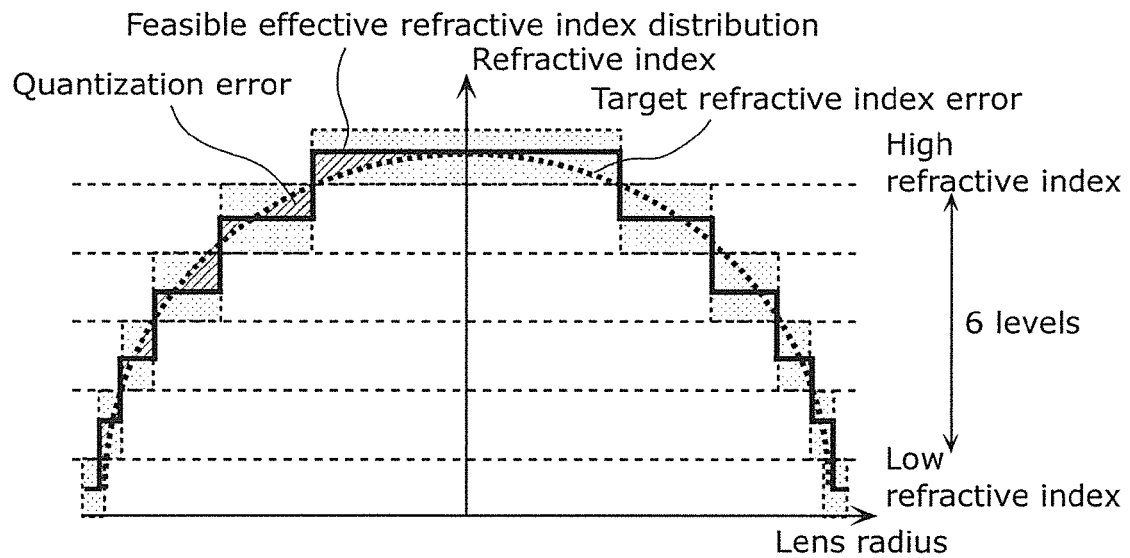
FIG. 7A shows a graph of quantization error, in effective refractive index distribution, which occurs in the case where the conventional minimum basic structure is used.
Figure 7B:
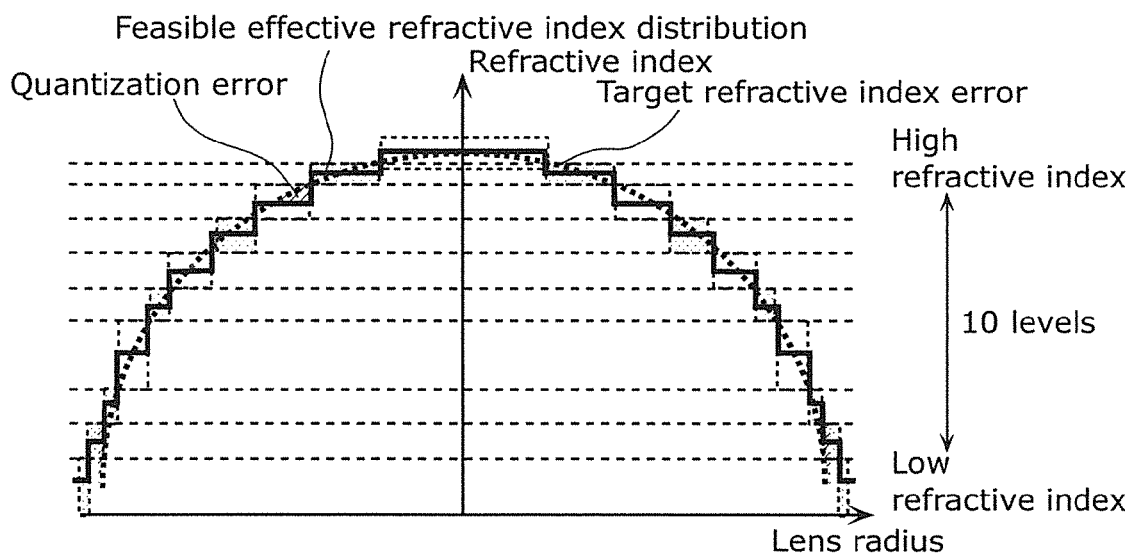
FIG. 7B shows a graph of quantization error, in effective refractive index distribution, which occurs in the case where the minimum basic structure according to the embodiment is used.

FIG. 7A shows a graph of quantization error, in effective refractive index distribution, which occurs in the case where the conventional minimum basic structure is used. FIG. 7B shows a graph of quantization error, in effective refractive index distribution, which occurs in the case where the minimum basic structure according to the embodiment is used. FIG. 7A and FIG. 7B both show the target desirable refractive index distribution (target value) and the feasible effective refractive index distribution by the respective minimum basic structures. The parabola (target refractive index distribution) shown in each of the effective refractive index shown in FIG. 7A and FIG. 7B indicates an effective refractive index distribution for collecting the incident light at a focal length of Df represented by the following Equation.

$$\Delta n(x) = \Delta n_{max}[(A(x^2 + B \times \sin \theta)/2\pi + C] \quad \text{(Equation 2-1)}$$

Here, A, B, and C are constants, and $\Delta n_{max}$ represents a difference (0.45) in refractive index between $SiO_2$ which is the light-transmissive film and the air.

Furthermore, in Equation 2-1 above, each of the parameters where n0 represents a refractive index of medium at the incident side and n1 represents a refractive index of medium at the emission side is as follows.

$$A = -(k_0 n_1)/2Df \quad \text{(Equation 2-2)}$$

$$B = -k_0 n_0 \quad \text{(Equation 2-3)}$$

$$K_0 = 2\pi/\lambda \quad \text{(Equation 2-4)}$$

With this, the light-collecting element can be optimized per target focal length Df, a target incident angle θ of the targeted incident, and a wavelength λ. In Equation 2-1 above, the light-collecting component is represented by a quadratic function of the distance x from the pixel center in a direction toward the peripheral portion, and the deflection component is represented by the product of the distance x and the trigonometric function.

As it is clear from the comparison on the effective refractive index distribution shown in FIG. 7A and FIG. 7B, there is a large difference in the quantization error between the case where the conventional minimum basic structure is used and the case where the minimum basic structure in the present embodiment is used. With the conventional minimum basic structure, the quantization error is large which makes it impossible to realize the desired light-collecting performance, which may lower the light-collection efficiency.

Figure 8A:
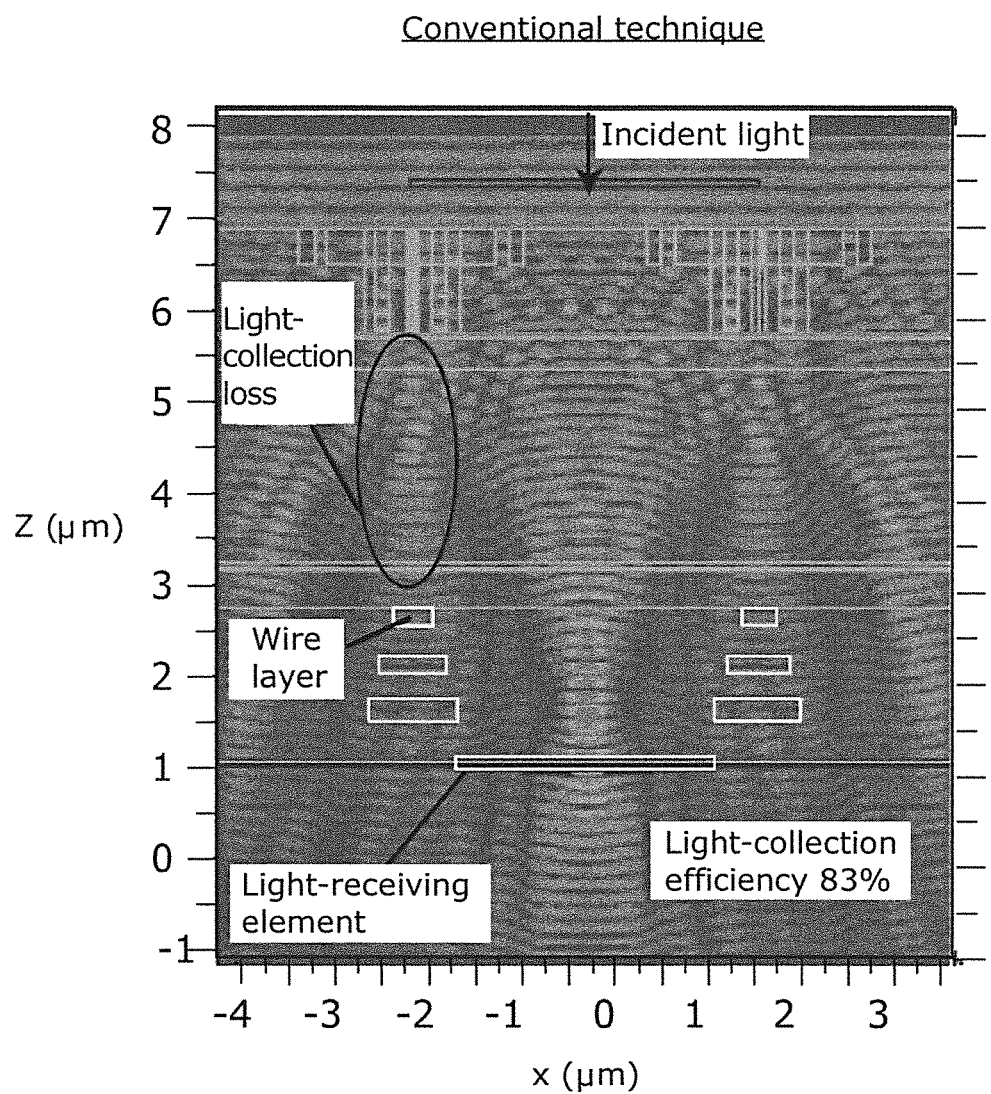
FIG. 8A shows a result of calculation on the light-collection property of the solid-state imaging apparatus provided with the conventional light-collecting element.
Figure 8B:
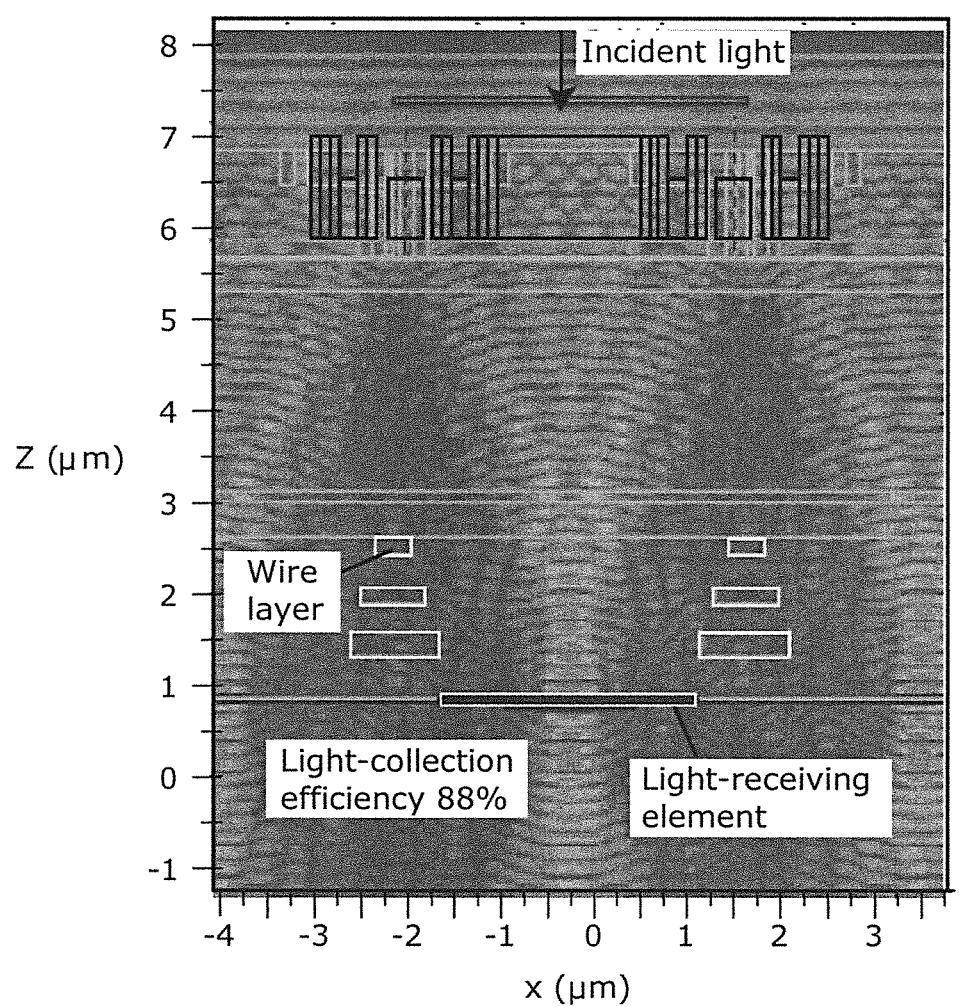
FIG. 8B shows a result of calculation on the light-collection property of the solid-state imaging apparatus provided with the light-collecting element according to the embodiment.
Figure 9:
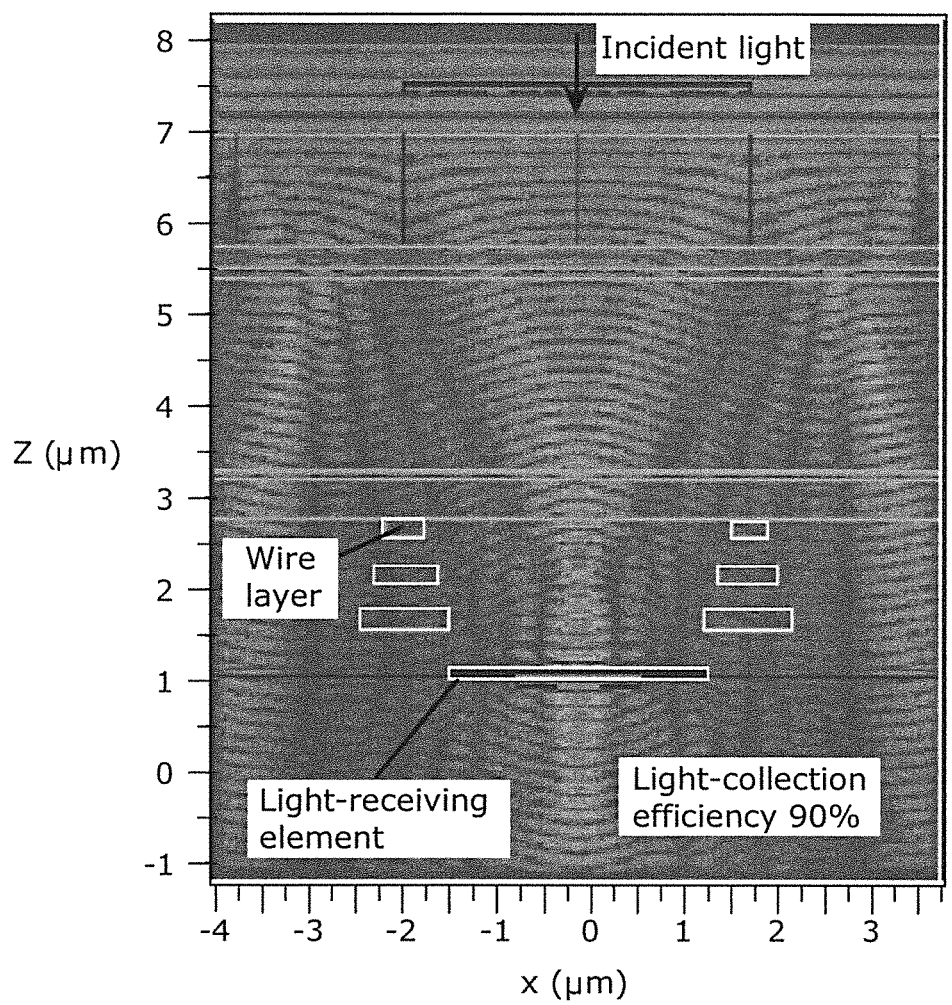
FIG. 9 shows a result of calculation on the light-collection property of the solid-state imaging apparatus provided with the light-collecting element having ideal effective refractive index distribution with no quantization error.
Figure 10:
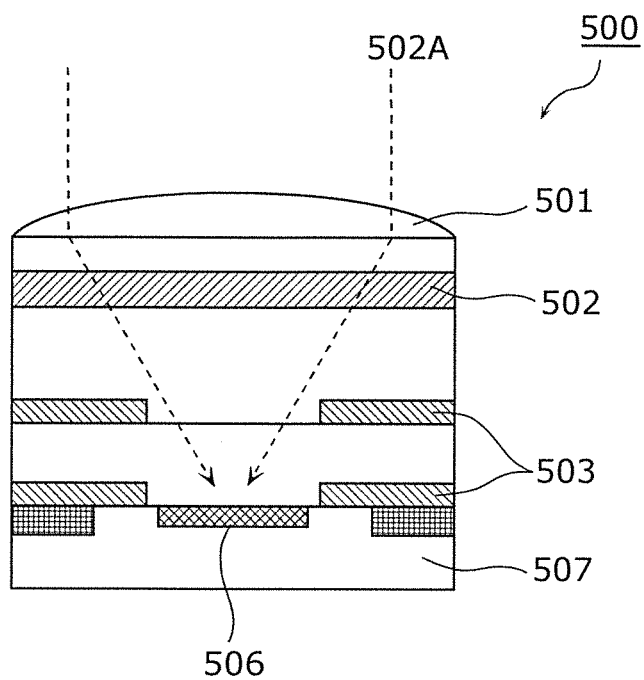
FIG. 10 shows an example of a basic structure of a pixel in a conventional solid-state imaging apparatus.
Figure 11:
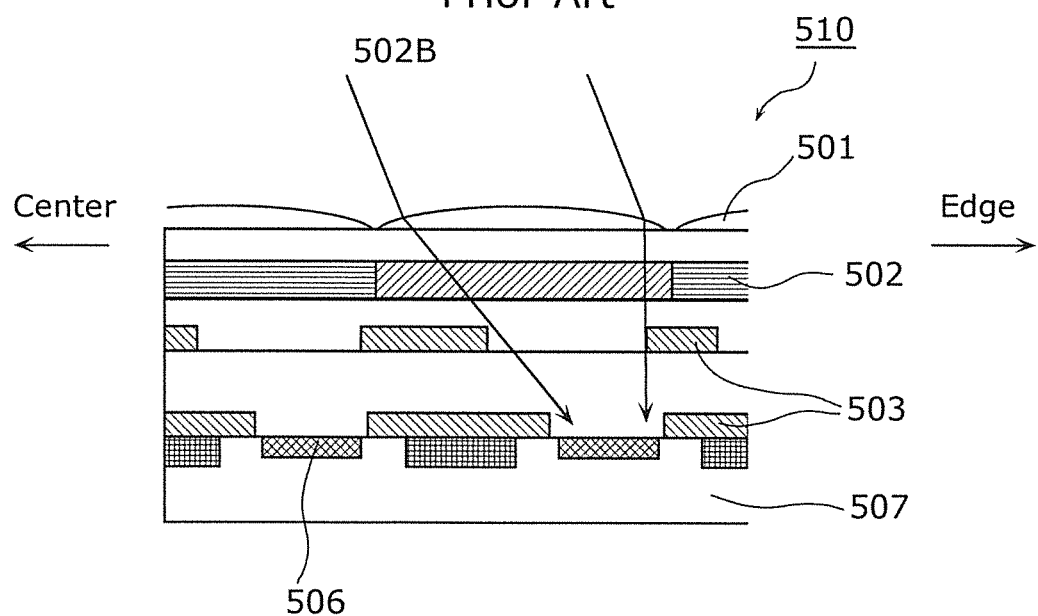
FIG. 11 shows an example of a structure of a peripheral pixel in the conventional solid-state imaging apparatus.

FIG. 8A shows a result of calculation on the light-collection property of the solid-state imaging apparatus provided with the conventional light-collecting element. FIG. 8B shows a result of calculation on the light-collection property of the solid-state imaging apparatus provided with the light-collecting element according to the embodiment. FIG. 9 shows a result of calculation on the light-collection property of the solid-state imaging apparatus provided with the light-collecting element having ideal effective refractive index distribution with no quantization error. These calculation results show how the light generated at the set light-source enters into the surface of the solid-state imaging apparatus and propagates through the entire solid-state imaging apparatus including the light-receiving element, based on the electromagnetic field simulation using the finite element technique. The incident light is set to have the wavelength of 540 nm, and the incident angle is set to be parallel to the surface of the solid-state imaging apparatus.

According to the comparison result on the distribution diagram of the light-collection property shown in FIG. 8A and FIG. 8B, it can be confirmed that in the light-collection distribution of the light-collecting element 1 in the present disclosure, the light is collected to the light-receiving element more efficiently as compared to the light-collection distribution of the conventional light-collecting element. Specifically, in the conventional light-collecting element, loss of light-collection is caused because a part of the incident light is blocked by the wire layer which is the light-blocking film in the solid-state imaging apparatus. In contrast, with the light-collecting element 1 in the present disclosure, the light is collected to the light-receiving element efficiently without being blocked by the wire layer. This is because of a difference in reproducibility between the conventional technique and the present disclosure, which indicates that the light-collecting performance can be improved by reducing the quantization error.

Here, in order to quantify the light-collecting performance improvement effect, a comparison is performed on the light-collection efficiency of the conventional technique and the present disclosure by setting as the light-collecting efficiency a value obtained by dividing the light-receiving intensity of the light-receiving element obtained by the calculation result by the incident intensity. According to the result, the conventional solid-state imaging apparatus has the light-collection efficiency of 83%, while the solid-state imaging apparatus according to the present embodiment has the light-collection efficiency of 88% which is approximately 1.1 times higher than the conventional solid-state imaging apparatus. This result indicates that the light-collecting element 1 in the present disclosure realizes substantially the same light-collection performance as the light-collecting element having smooth refractive index distribution with no quantization error shown in FIG. 9, that is the light-collection efficiently of 90%, and that an advantageous effect brought by the quantization error reduction is obtained sufficiently.

As described above, the solid-state imaging apparatus according to the present embodiment includes a plurality of zones each having a ring shape of concentric structure and a line width shorter than a wavelength of the incident light; and has an effective refractive index distribution controlled according to a combination of the zones. Furthermore, in at least one of the zones, a light-transmissive film which is included in the zone is divided in a circumferential direction of the concentric structure at an interval shorter than the wavelength of the incident light. Specifically, the light-transmissive film of the zone includes a plurality of arc-shaped light-transmissive film elements divided at an interval shorter than the wavelength of the incident light.

With the light-collecting element of the above-described solid-state imaging apparatus according to the present embodiment, a more accurate effective refractive index distribution is realized by combining the minimum basic structures having the filling rate and variations in the shape, without performing the complicated process including: dividing the layering process into a plurality of processes; and patterning the light-transmissive film per layering process while aligning the masks in each processing. With this, reproducibility of the desirable refractive index distribution of the light-collecting element can be improved without increasing the number of masks or manufacturing processes. Therefore, reproducibility of the desirable refractive index distribution of the light-collecting element can be improved without increasing the number of masks or manufacturing processes. With this, the light-collection efficiency improves and the sensitivity of the solid-state imaging apparatus improves.

The above has described the solid-state imaging apparatus and the imaging apparatus in the present disclosure based on the embodiments. However, the solid-state imaging apparatus and the imaging apparatus according to the present disclosure are not limited to these embodiments. Other embodiments achieved by combining arbitrary constituents in the above embodiment, modification examples obtained by applying various modifications conceived by those skilled in the art to the above embodiment within a scope that does not deviate from the spirit of the present invention, and various devices including the solid-state imaging apparatus or the imaging apparatus according to the present disclosure is also included in the present disclosure.

Although a CMOS solid-state imaging apparatus is used as an example in the above embodiment, the present disclosure is not limited to the above and the same advantageous effect can be obtained with a CCD solid-state imaging apparatus.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

With the solid-state imaging apparatus according to the present disclosure, performance is enhanced and costs are reduced for image sensor products, such as digital video cameras, digital still cameras, mobile phones with cameras, surveillance cameras, vehicle-mounted cameras, broadcast cameras, and so on. Thus, the solid-state imaging apparatus according to the present disclosure is commercially useful.

The invention claimed is:

1. A solid-state imaging apparatus comprising unit pixels, the unit pixels each having a light-collecting element for collecting incident light,
   wherein the light-collecting element is divided into a plurality of zones each having a ring shape of a concentric structure and a line width shorter than a wavelength of the incident light,
   the light-collecting element has an effective refractive index distribution controlled according to a combination of the zones,
   in at least one of the zones, a light-transmissive film is disposed in the zone and is divided in a circumferential direction of the concentric structure at an interval shorter than the wavelength of the incident light,
   the light-transmissive film has a first thickness and a second thickness greater than the first thickness in the circumferential direction of the concentric structure,
   the light-transmissive film of the zone includes a plurality of arc-shaped light-transmissive film elements divided at an interval shorter than the wavelength of the incident light, and
   the arc-shaped light-transmissive film elements are provided continuously with a light-transmissive film in a ring shape arranged along an inner circumference or an outer circumference of the arc-shaped light-transmissive film element.

2. The solid-state imaging apparatus according to claim 1, wherein the arc-shaped light-transmissive film elements are each disposed on a same circumference concentric to a center of one of the unit pixels.

3. An imaging apparatus comprising:

the solid-state imaging apparatus according to claim 1; and an imaging lens arranged on a light incident side of the light-collecting element, the imaging lens being for guiding light, wherein the imaging lens is an interchangeable lens including a first imaging lens which guides the light onto the light-collecting element in a wide-angle manner, and a second imaging lens which guides the light onto the light-collecting element telecentrically.

4. A solid-state imaging apparatus comprising unit pixels, the unit pixels each having a light-collecting element for collecting incident light, wherein the light-collecting element is divided into a plurality of zones each having a ring shape of a concentric structure and a line width shorter than a wavelength of the incident light, the light-collecting element has an effective refractive index distribution controlled according to a combination of the zones, the plurality of zones includes a first zone and a second zone adjacent to the first zone, a first light-transmissive film is disposed in the first zone, a second light-transmissive film is disposed in the second zone, the first light-transmissive film includes plural arc-shaped light-transmissive film elements divided in a first circumferential direction of the first zone at an interval shorter than the wavelength of the incident light, the second light-transmissive film includes plural arc-shaped light-transmissive film elements divided in a second circumferential direction of the second zone at an interval shorter than the wavelength of the incident light, the plural arc-shaped light-transmissive film elements in the first zone include a first arc-shaped light-transmissive film element, the plural arc-shaped light-transmissive film elements in the second zone include a second arc-shaped light-transmissive film element, and the first arc-shaped light transmissive film element is in direct contact with the second plural arc-shaped light-transmissive film element.

5. The solid-state imaging apparatus according to claim 4, wherein the first arc-shaped light-transmissive film element has a first thickness, and the second arc-shaped light-transmissive film element has a second thickness different from the first thickness.

6. A solid-state imaging apparatus comprising unit pixels, the unit pixels each having a light-collecting element for collecting incident light, wherein the light-collecting element is divided into a plurality of zones each having a ring shape of concentric structure and a line width shorter than a wavelength of the incident light, the light-collecting element has an effective refractive index distribution controlled according to a combination of the zones, the plurality of zones includes a first zone and a second zone adjacent to the first zone, a first light-transmissive film is disposed in the first zone, a second light-transmissive film in a ring shape is disposed in the second zone, the first light-transmissive film includes plural arc-shaped light-transmissive film elements divided in a first circumferential direction of the first zone at an interval shorter than the wavelength of the incident light, at least one of the plural arc-shaped light transmissive film elements is in direct contact with the second light-transmissive film, wherein the at least one of the plural arc-shaped light-transmissive film elements has a first thickness, and the second light-transmissive film has a second thickness different from the first thickness.

7. The solid-state imaging apparatus according to claim 6, wherein the second light-transmissive film is a continuous ring shape.

* * * * *